United States Patent [19]

Newell et al.

[11] Patent Number: 5,150,121
[45] Date of Patent: Sep. 22, 1992

[54] PARAMETER SENSING AND PROCESSING SYSTEM

[75] Inventors: Gerald R. Newell, Alamo; Pradeep Bhardwaj, Danville, both of Calif.

[73] Assignee: New SD, Inc., San Francisco, Calif.

[21] Appl. No.: 583,654

[22] Filed: Sep. 14, 1990

Related U.S. Application Data

[63] Continuation-in-part of Ser. No. 257,509, Oct. 13, 1988, Pat. No. 4,980,687.

[51] Int. Cl.⁵ .............................................. H03M 1/60
[52] U.S. Cl. ..................................... 341/157; 341/166
[58] Field of Search ............... 341/157; 307/308, 309, 307/514, 515

[56] References Cited

U.S. PATENT DOCUMENTS

| | | | |
|---|---|---|---|
| 3,019,296 | 1/1962 | Schelleng | 179/15.5 |
| 3,573,794 | 4/1971 | Widenor | 341/157 |
| 3,868,677 | 2/1975 | Kidd | 341/157 |
| 3,916,179 | 10/1975 | Cuzzo | 235/183 |
| 4,025,868 | 5/1977 | Miki et al. | 328/141 |
| 4,031,532 | 6/1977 | First | 340/347 NT |
| 4,190,823 | 2/1980 | Leichle | 341/157 |
| 4,321,548 | 3/1982 | Jeenicke et al. | 328/143 |
| 4,435,697 | 3/1984 | Takahashi | 340/347 AD |
| 4,525,069 | 6/1985 | Tanaka et al. | 356/435 |
| 4,594,555 | 6/1986 | Hilton | 329/135 |
| 4,672,331 | 6/1987 | Cushing | 341/157 |
| 4,692,933 | 9/1987 | Wrablewski | 377/29 |

Primary Examiner—Howard L. Williams
Attorney, Agent, or Firm—Flehr, Hohbach, Test, Albritton & Herbert

[57] ABSTRACT

A voltage-to-frequency converter provides an output signal, the frequency of which is proportional to the instantaneous level of a reference-frequency signal, which is proportional to the output signal of a parameter-sensing circuit. An up-down frequency counter counts the output pulses of the voltage-to-frequency converter. An up-down control terminal coupled to the reference-frequency signal switches the counting direction of the up-down counter to demodulate the output signal of the voltage-to-frequency converter and to provide a digital output signal representative of the time integral of the amplitude of the parameter being sensed.

An undersired input signal is reduced by subtracting a cancellation signal having the format of the undesired signal from the undesired input signal. The filter includes a subtractor, or difference circuit, the output of which is coupled to a voltage-to-frequency converter. A feedback path is provided between the output terminal of the voltage-to-frequency converter and one input terminal of the difference circuit. The feedback path includes a circuit for selectively converting the frequency output signal representing the undesired input signal to a cancellation signal. The circuit for selectively converting includes a synchronous carrier signal generator and a reversible up-down counter.

12 Claims, 10 Drawing Sheets

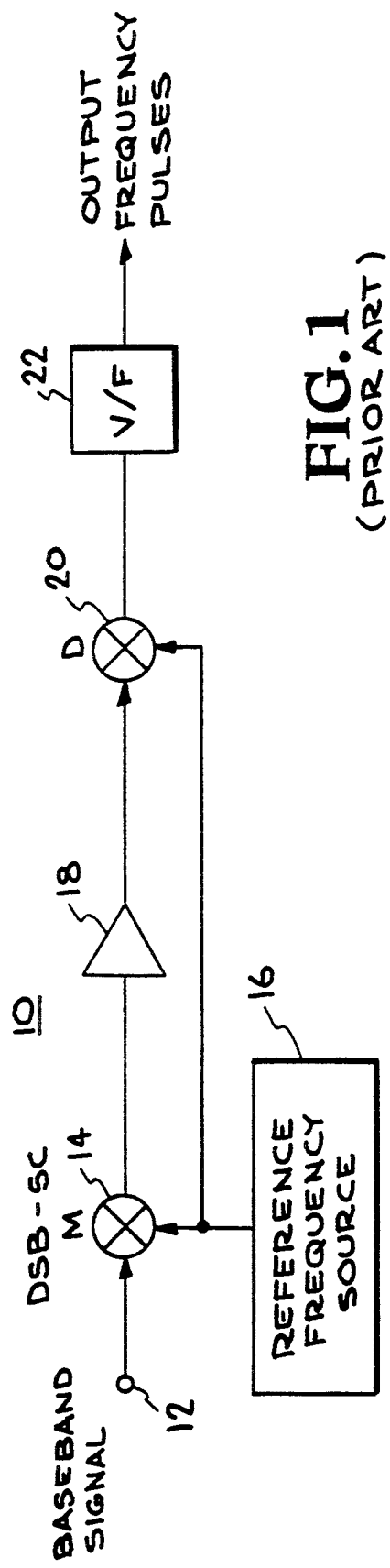
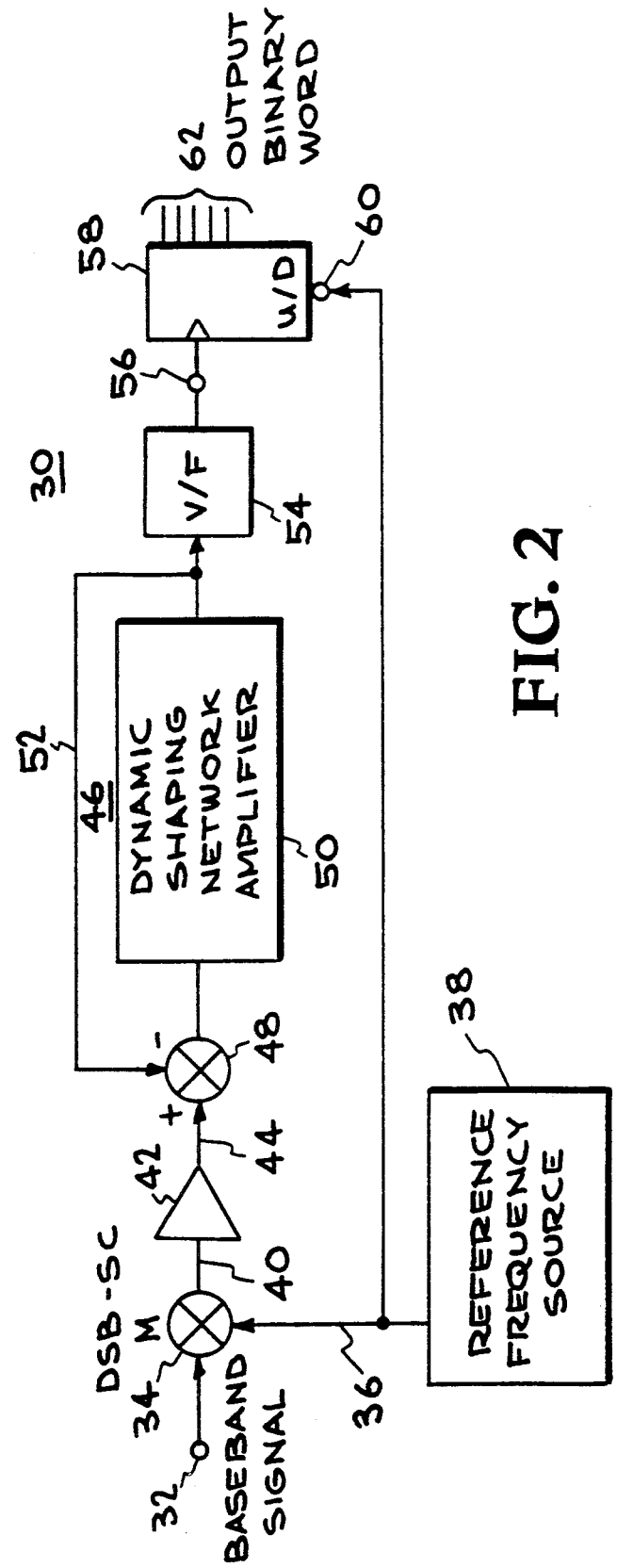

PARAMETER SENSING AND PROCESSING SYSTEM

CROSS REFERENCE TO RELATED APPLICATION

This is a continuation-in-part of Ser. No. 257,509 filed Oct. 13, 1988, now U.S. Pat. No. 4,980,687.

BACKGROUND OF THE INVENTION

1. FIELD OF THE INVENTION

This invention relates to systems for processing signals and, more particularly, to systems for digitally filtering undesired signals and for sensing physical parameters.

2. PRIOR ART

In certain applications signals are produced which may vary over a range of a million to one, requiring signal resolutions of one part per million. For example, certain inertial navigation systems require such accuracy. For achieving a dynamic range of a million to one, a conventional parallel analog-to-digital conversion circuit requiring 20 bits per sample would be extremely difficult to fabricate and keep in calibration with aging of components and over a range of temperatures. For these applications, a voltage-to-frequency converter is normally used which generates an output signal having a frequency proportional to the voltage level of an input baseband signal. By counting the frequency of the signal produced by the voltage-to-frequency converter over a finite time interval, a quantity representing the integral of the input baseband signal can be computed. The input baseband signals to be measured in such systems have a frequency range which extends down to dc. Shifts in dc level in the circuits of a system are caused, for example, by temperature changes or by subjection to external radiation. Consequently, any shifts in the dc level within any circuit handling a baseband signal limits the voltage accuracy of a system.

SUMMARY OF THE INVENTION

It is an object of the invention to provide a system for sensing and measuring a parameter, which system is relatively insensitive to shifts in dc level.

It is another object of the invention to provide a system for filtering an undesired input signal which is also relatively insensitive to shifts in dc level.

In accordance with these and other objects of the invention, a system is provided for sensing a parameter such as, for example, temperature or pressure. Parameter-sensing means are provided for sensing the value of a parameter and also for providing, at an output terminal, a reference-frequency signal which has its amplitude proportional to the value of the parameter being sensed. The output signal of the parameter-sensing means is coupled to a voltage-to-frequency converter, which provides an output signal, the frequency of which is proportional to the level of the output signal of the parameter-sensing means. The output signal of the voltage-to-frequency converter is inputted to a frequency-to-digital converter, which includes an up/down frequency counter for counting the output frequency of the voltage-to-frequency converter. An up/down control terminal is provided to which is coupled the reference-frequency signal, which switches the counting direction of the counter in synchronism with the reference-frequency signal to thereby demodulate the output signal of the voltage-to-frequency converter and to provide a digital output signal representative of the integral of the reference-frequency signal as modified by the parameter-sensing means. The parameter-sensing means alternatively includes a voltage divider circuit or a bridge circuit, each having parameter-sensitive elements.

A filter is provided for reducing an undesired input signal. The filter includes a difference circuit for taking the difference between two input signals and providing an output difference signal. A voltage-to-frequency converter is provided which has its input terminal coupled to the output of the difference circuit. The output terminal of the voltage-to-frequency converter provides an output signal frequency corresponding to the signal level at its input terminal. A feedback path is provided which couples the output terminal of the voltage-to-frequency converter to one of the input terminals of the difference circuit, where the other input terminal of the difference circuit has an undesired input signal coupled thereto. The feedback path includes means for selectively converting the frequency output signal, which represents the undesired input signal, to a cancellation signal having the format of the undesired input signal. The cancellation signal is coupled to the second input terminal of the difference circuit to thereby cancel the undesired input signal. The means for selectively converting includes means for providing a carrier signal synchronous with the undesired signal and a reversible up/down counter which is synchronously reversed to provide a digital output signal which is the integral of the output signal on the voltage-to-frequency converter.

Several embodiments of the means for selectively converting are provided. One includes a multiplying digital-to-analog converter for multiplying the carrier signal by the digital output signal of the counter. Another means for selectively converting includes a digital-to-analog converter for converting the digital output signal of the counter to an analog output signal. The analog output signal is then multiplied by the carrier signal. Two or more feedback paths are accommodated by using a multiplexer and sample-and-hold circuits for selecting digital output signals from two or more counters to provide analog signal representations of the digital output signals of the counters. Still another embodiment of the invention provides means for selectively converting which includes a digital multiplier for multiplying the carrier signal by the digital output signal of the counter and digital-to-analog converter means for converting the output signal of the digital multiplier to analog form.

The filter according to the invention provides a carrier signal which is in phase with the undesired input signal and cancels the in-phase component of the undesired signal. To provide for cancellation of a quadrature component of the undesired input signal, the filter includes a second feedback path. The second feedback path provides a second quadrature cancellation signal and includes a second means for selectively converting which provides a carrier signal in quadrature with the undesired signal. This type of filter also includes a summer for summing both the in-phase and the quadrature cancellation signals.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 shows a prior art system for amplifying a DSB-SC signal modulated by a very low frequency baseband signal.

FIG. 2 shows a system according to the invention for digitally demodulating an in-phase component of a baseband signal from a frequency-encoded version of double-sideband suppressed-carrier (DSB-SC) signal to provide a digitally formatted version of the integral of the in-phase component of the baseband signal.

DETAILED DESCRIPTION OF THE PREFERRED EMBODIMENTS

Figure 3:
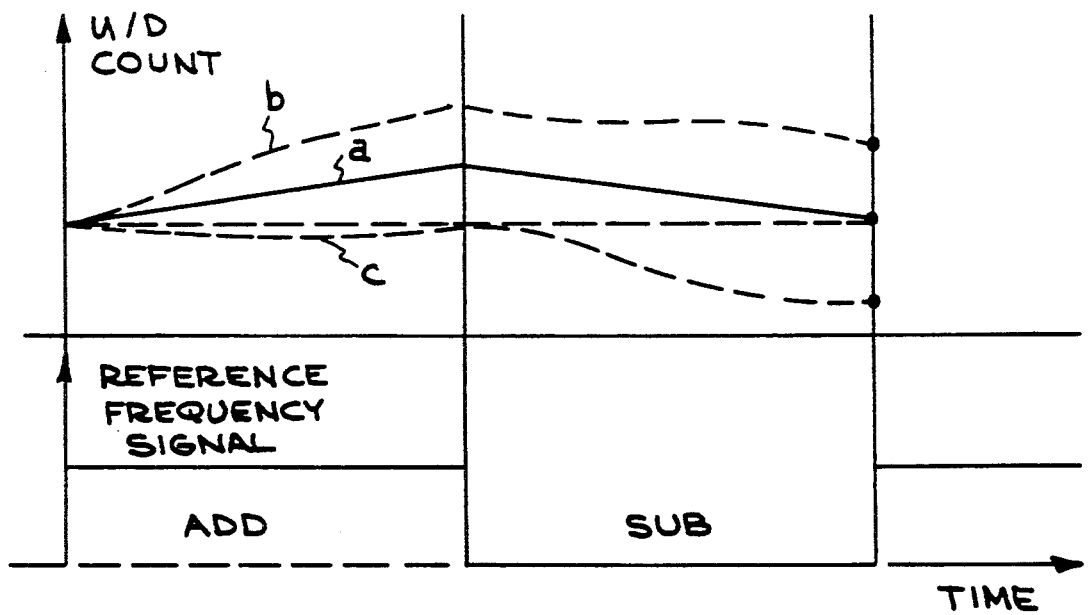
FIG. 3 shows waveform drawings representing the up/down counter output count which changes direction under the control of a square-wave reference-frequency signal.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Referring now to the drawings, FIG. 1 shows a prior art system 10 for processing a low-level baseband signal connected to an input terminal 12 of a double-sideband, suppressed-carrier DSB-SC modulator 14. The baseband signal has a frequency range of, for example, dc to several hundred Hertz. The modulator 14 is, for example, a balanced modulator which multiplies the baseband signal by a reference-carrier signal from a reference-carrier frequency source 16 to produce a low-level DSB-SC output signal at its output terminal. The DSB-SC signal is processed by being amplified and filtered, as required, in an amplifier 18, which can be, for example, a bandpass amplifier having the reference-carrier frequency as its center frequency. The amplified DSB-SC signal is then converted back down to baseband by being synchronously detected in a demodulator 20 with a reference-frequency signal from the source 16. The demodulator baseband output signal is then direct-coupled to an analog-to-digital converter, such as a voltage-to-frequency converter 22. Voltage-to-frequency converters are often used where high precision measurements are required. The output frequency of the voltage-to-frequency converter 22 is proportional to the voltage level of the baseband signal. Because the baseband signal ranges from dc to several hundred Hertz, it is required to be dc-coupled to the voltage-to-frequency converter, which is susceptible to dc-voltage level drifts caused by aging, temperature, and irradiation by high energy. For applications requiring accuracies on the order of parts in one million, a system using dc coupling requires compensation and periodic calibration and such a system would be unusable after being irradiated with high energy.

FIG. 2 shows a system 30 according to the invention which avoids demodulating the DSB-SC signal prior to conversion to a digital format. A baseband signal is connected to an input terminal 32 of a double-sideband, suppressed-carrier DSB-SC modulator 34. The baseband signal may typically be an analog signal having a frequency range of, for example, dc to several hundred Hertz and may require an accuracy of better than a few parts per million. The modulator 34 is, for example, a balanced modulator which linearly multiplies the baseband signal by a reference-carrier signal provided on signal line 36 from a reference-carrier frequency source 38. This produces a low-level DSB-SC output signal on the signal line 40 connected to the output terminal of the modulator 34. The modulation function may be performed by any of a number of different types of parameter sensing elements, for example, a strain gauge. Alternatively, in some applications a DSB-SC signal similar to that on signal line 40 and a reference-carrier signal similar to that provided on signal line 36 are derived in an external circuit or sensing element and provided as input signals to the system. The DSB-SC signal on line 40 is amplified in an amplifier 42 and then coupled on a signal line 44 to a linear feedback-amplifier subsystem 46. The amplifier sub-system 46 includes a summer 48 which has signal line 44 coupled to the positive input terminal thereof. The summer output is coupled to the input of a dynamic shaping network amplifier 50 which amplifies and filters the DSB-SC signal. The output of the network is then fed back on a feedback signal line 52 to the negative input terminal of the summer 48 to cancel any distortion introduced by the shaping network amplifier 50. The feedback ensures that the amplification and filtering are linear processes.

The amplified DSB-SC signal at the output of the amplifier 50 is not converted back down to the baseband analog domain. The DSB-SC signal is AC coupled to the input of a voltage-to-frequency converter 54, which provides an output signal comprising, for example, a series of digital pulses having a repetition rate, or frequency, which is proportional to the voltage level of the DSB-SC signal. Because the voltage-to-frequency converter is AC coupled, its input circuitry is not susceptible to dc-voltage level drifts caused by aging, temperature, and irradiation by high energy. AC coupling is well suited for applications requiring The output signal pulses of the voltage-to-frequency converter 54 are applied to the input signal terminal 56 of an up/down frequency counter 58. The counter functions as a digital accumulator, or integrator, of the signal pulses from the voltage-to-frequency converter. Since the various frequencies represent the various voltage levels of the DSB-SC signal, the output pulse stream of the V/F converter 54 represents the DSB-SC signal encoded in a "frequency" format, and the output reading of the counter 58 represents the integral of the demodulated baseband signal as a digital or binary number.

A reference-frequency signal from the source 38 is applied to the up/down control terminal 60 of the counter 58 to change the direction of the count depending on the polarity of the reference-frequency signal. For an up-count, the input frequency is added to the counter output total; and for a down-count, the input frequency is subtracted from the counter output total. If the reference-frequency signal applied to the up/down control terminal is a square wave with a 50% duty cycle, the reference frequency signal, in effect, alternately multiplies the counter output reading by plus one and by minus one. Multiplication of a DSB-SC signal in this manner by its carrier signal, i.e., the reference-frequency signal, synchronously demodulates the DSB-SC signal to produce the originally encoded baseband signal. Consequently, the output of the up/down counter 58 on data lines 62 is a digital word representing the integral of the baseband signal to an accuracy of one part in a million.

Typical numerical values for a system are: a baseband signal having a frequency range of dc to a few hundred Hz, a reference-frequency signal of 10 kHz., and a voltage-to-frequency full-scale range of zero to 10 MHz. For these exemplary values, it should be appreciated that a DSB-SC output signal frequency ranges over 10 kHz plus or minus a few hundred Hz. and that the corresponding output pulses from a voltage-to-frequency converter have a frequency range of zero to 10 Mhz.

FIG. 3 shows the output count of the up/down counter 58 as a function of time with a square-wave reference-frequency signal applied to the up/down control terminal 60 of the up/down counter 58. Assume that the voltage-to-frequency converter provides output signal pulses at a constant preselected rate when no DSB-SC signal is present at the input of the voltage-to-frequency converter 54. The solid line "a" represents the counter output for this no-signal condition. During the ADD portion of the reference-frequency signal, counts are added to the counter total, while during the SUBTRACT portion of the reference-frequency signal, counts are subtracted from the counter total. For the no-signal condition, the counter total as represented by the solid line "a" returns to the same number at the end of each reference-signal cycle. The dotted line "b" represents the counter output for the condition where the DSB-SC signal is in-phase with respect to the reference signal, and is super imposed on the no-signal level. In this case, the up-count during the ADD portion of the reference signal exceeds the down-count during the SUBTRACT portion of the reference-frequency signal, leaving a net positive count in the counter at the end of the reference-signal cycle. Similarly, the dotted line "c" represents the counter output for the condition where the DSB-SC signal is out of phase with respect to the reference signal. In this case, the upcount during the ADD portion of the reference signal is less than the down-count during the SUBTRACT portion of the reference-frequency signal, leaving a smaller net count in the counter at the end of the reference-signal cycle. Note that at the end of each full cycle of the reference-signal the counter output represents the samples of the integral of the baseband signal as a function of time. Also note that if the counter is read and reset, periodically, for example at the end of each cycle of the reference-signal, then the readings will be proportional to the baseband signal rather than its integral.

Figure 4:
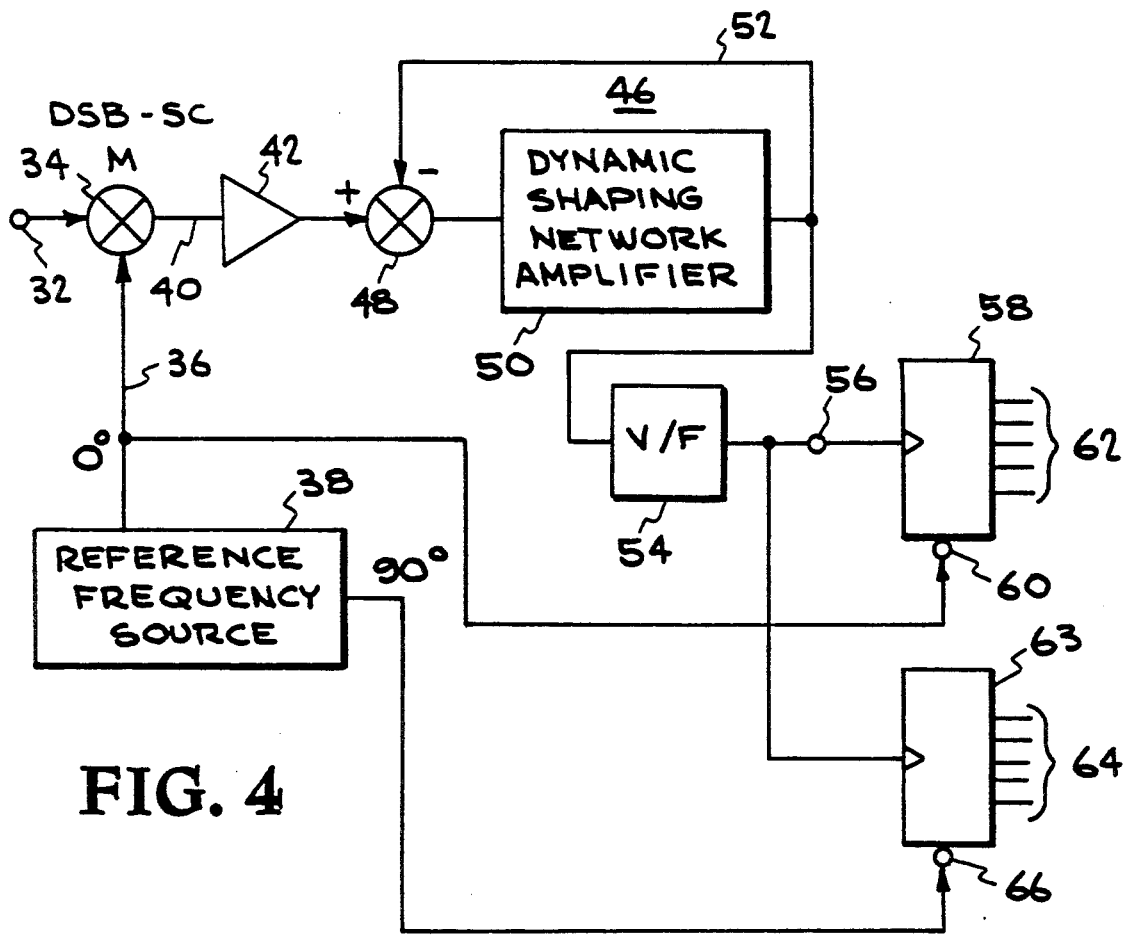
FIG. 4 shows the system of FIG. 2 which further includes a system according to the invention for digitally demodulating the quadrature component of a baseband signal from a frequency-encoded version of DSB-SC signal to provide a digitally formatted version of the integral of the quadrature component of the baseband signal.

FIG. 4 shows the system of FIG. 2 which further includes an up/down counter 63 according to the invention for digitally demodulating the quadrature component of the DSB-SC signal on signal line 40 from a frequency-encoded version of said DSB-SC signal to provide a digitally formatted version of the integral of the quadrature component of the baseband signal at the output data lines 64. The quadrature component may be present in the DSB-SC signal on signal line 40 for any of a number of reasons: it may be due to phase shifts introduced in modulator 34, or errors in external circuits or sensing elements, or it may be an entirely unique and useful quantity encoded in quadrature in addition to that encoded in-phase.

In FIG. 4, a second DSB-SC signal, having a suppressed carrier which is in quadrature with the in-phase reference-frequency signal, can be produced using the 90° component of the reference frequency source 38 and a modulator similar to the modulator 34. This second DSB-SC signal is injected into the input terminal of amplifier 42. Consequently, the quadrature output data lines 64 provide a digitally-formatted representation of the integral of a baseband signal encoded on the quadrature reference signal. An application of this concept is in a multisensor where angular rate information and linear acceleration information are both carried as DSB-SC signals in quadrature on the same signal line. For this quadrature-signal demodulation, a quadrature reference-frequency signal, at 90 degrees from the in-phase reference-frequency signal, is provided from the source 38 to the up/down control terminal 66 of the up/down counter 63. Counter 63 functions in the same manner as counter 56 to produce a digitally formatted version of the integral of the quadrature-phase component of the baseband signal.

Figure 5:
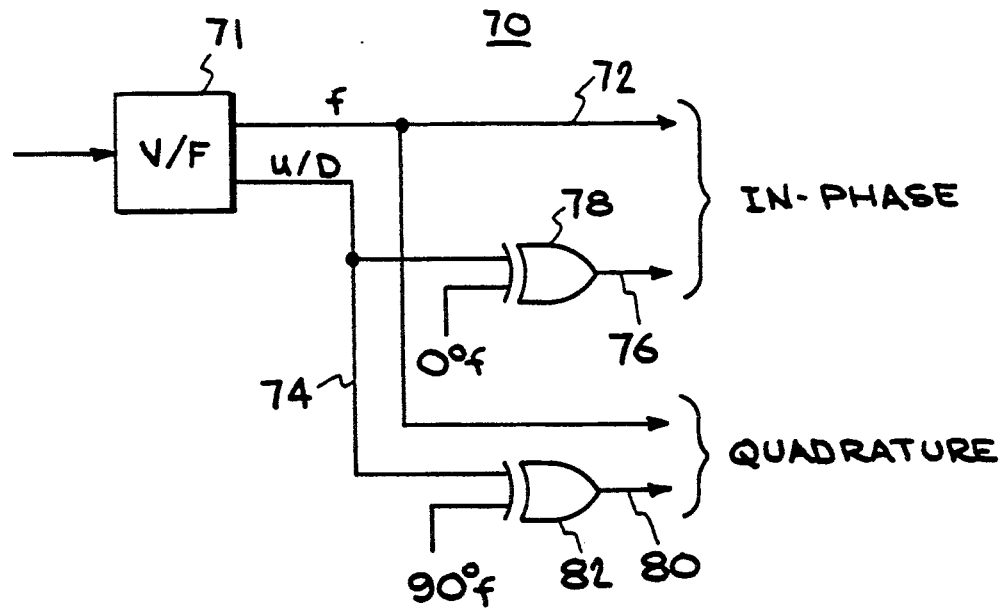
FIG. 5 shows a system according to the invention for providing a frequency-encoded signal which is represented by a frequency component and a sign bit component.

FIG. 5 shows an alternative system 70 for demodulating a DSB-SC signal when a voltage-to-frequency converter 71 encodes the voltage levels of said DSB-SC signal into two component signals. In the "bi-polar"

representation, one component signal, provided on signal line 72, is a frequency-component signal, which is proportional to the absolute value of the difference between the DSB-SC voltage level and a reference voltage level, such as, for example, the DSB-SC no-signal level. The other component, which is provided on signal line 74 is an up/down signal component, which digitally represents whether the voltage level of the DSB-SC signal is greater than or less than the reference voltage level. This system 70 for demodulating a DSB-SC signal provides the frequency-component signal as an output signal on line 72. Multiplying the up/down signal with the in-phase reference carrier signal to provide an in-phase, sign-bit output signal on signal line 76 is performed with an EXCLUSIVE-OR gate 78, which has the up/down signal and the in-phase reference-carrier signal as input signals and which provides the in-phase sign-bit of the in-phase frequency-component signal. For obtaining a quadrature sign-bit on signal line 80, an EXCLUSIVE-OR gate 82 is provided which has the up/down signal and the quadrature reference-carrier signal as input signals.

Figure 6:
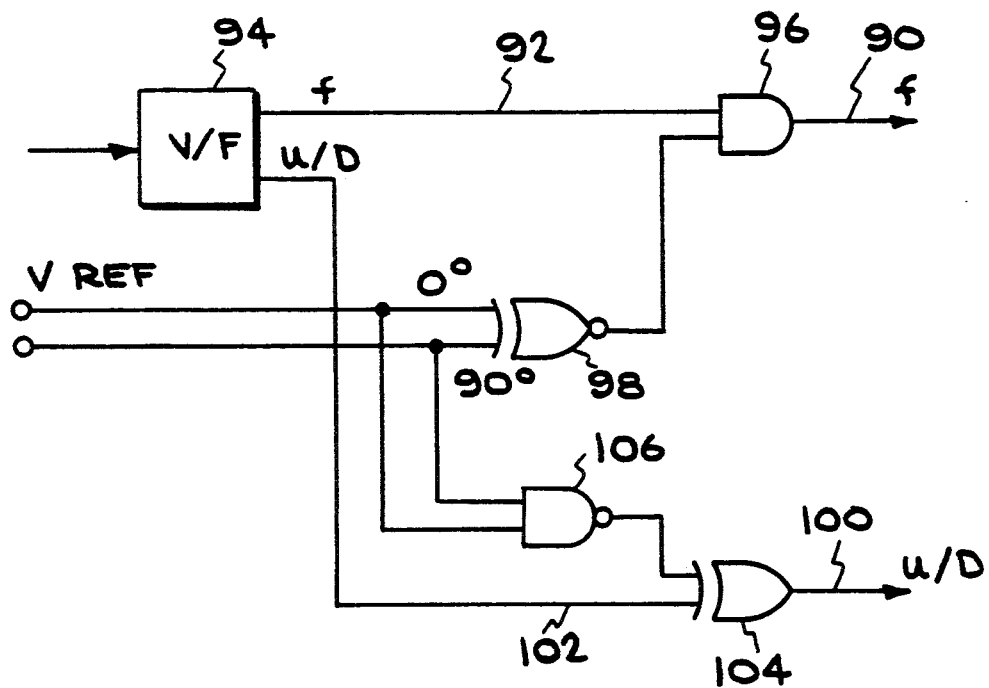
FIG. 6 shows a system according to the invention for obtaining a frequency encoded digital representation of both the in-phase and quadrature components of a baseband signal.

FIG. 6 shows a system for obtaining a "bi-polar" two-component set of signals for representing demodulation of an entire baseband signal. For the frequency representation on signal line 90, the output frequency component on signal line 92 of the voltage-to-frequency converter 94 is multiplied in an AND gate 96 by the output of an EXCLUSIVE-NOR gate, with the inputs to the EXCLUSIVE-NOR GATE 98 being the in-phase component and the quadrature component of the frequency-reference signal. For the sign-bit, or U/D, representation on signal line 100, the output sign-bit component on signal line 102 of the voltage-to-frequency converter 94 is added in an EXCLUSIVE-OR gate 104 by the output of a NAND gate 106, with the inputs to the NAND gate 106 being the in-phase component and the quadrature component of the frequency-reference signal. The output represents the algebraic sum of the baseband representation of the in-phase and quadrature components of a DSB-SC signal.

Figure 7:
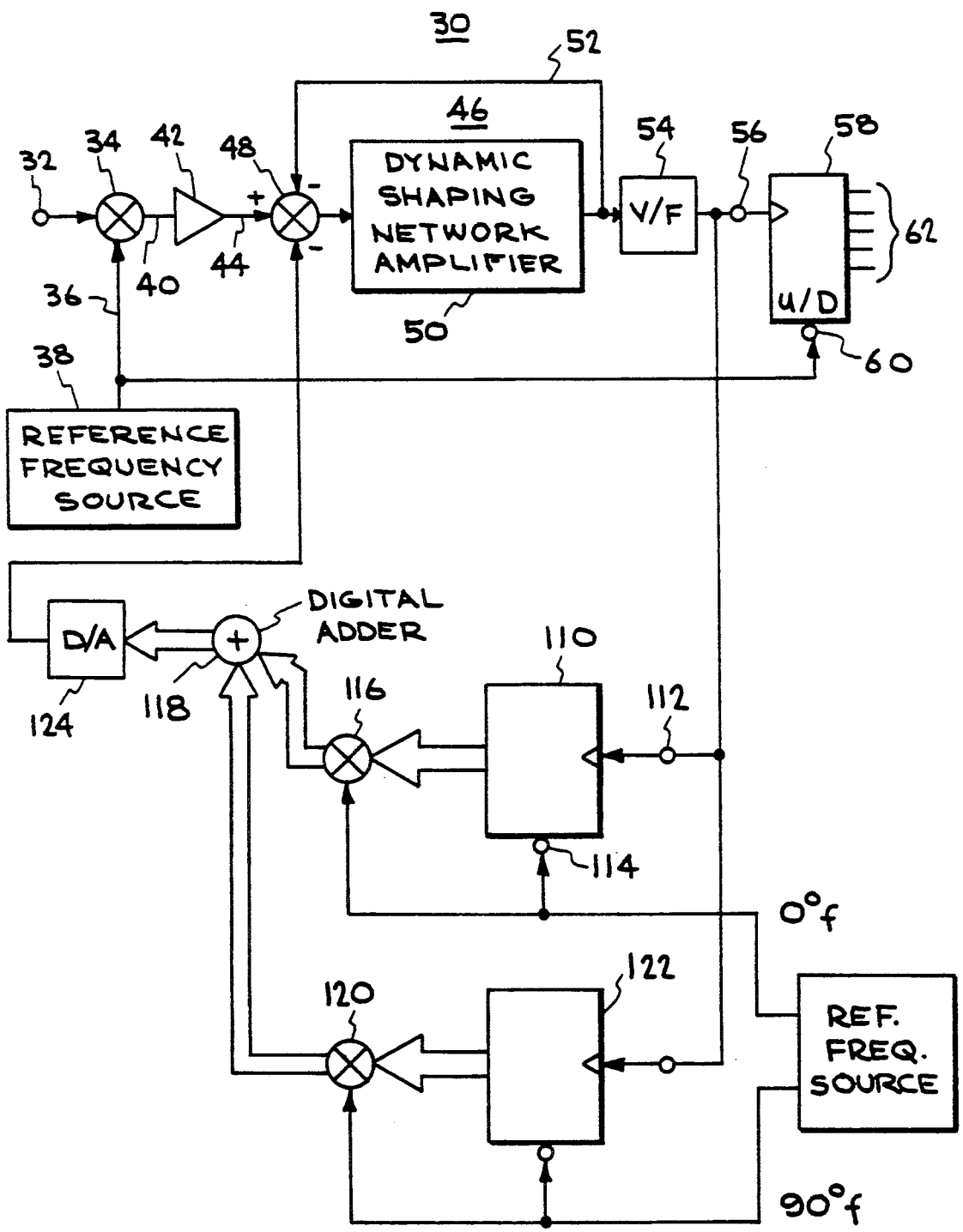
FIG. 7 shows a system according to the invention which digitally demodulates a baseband signal and which also provides a notch filter for an undesired input signal.

FIG. 7 shows a notch filter for rejecting an undesired input signal, which is, for example, a 60 Hz. baseband signal or some other signal in either the baseband or the frequency band of the DSB-SC signal which is at a sufficient level to interfere with the operation of the system 30 shown in FIG. 2. This notch filter utilizes the summer 48, the voltage-to-frequency converter 54, and a feedback path coupled between the output of the voltage-to-frequency converter 54 and another negative input terminal of the summer 48. The undesired signal is added to the desired signal to form a composite signal which is passed to the voltage-to-frequency converter 54 where it is converted to a series of frequency-encoded pulses. The feedback path generically includes a means for selectively converting undesired signal to a cancellation signal which has the same format as the undesired signal, for example, a DSB-SC analog signal. The cancellation signal is then coupled to the other, or second, negative input terminal of said summer to cancel the undesired input signal. In effect, an approximately equal and opposite signal, called the cancellation signal, is developed in the feedback path to cancel the original undesired input signal. In the embodiment of the selective feedback path shown in FIG. 7 the up/down counter 110 has the output of the voltage-to-frequency converter 54 fed to its signal input terminal, while a carrier signal synchronous with the undesired signal is coupled to the up/down control terminal 114 of the counter 110. This arrangement provides two functions: one is to demodulate the frequency pulses to a digitally formatted baseband signal at the output of the counter and the other is to integrate that signal. The integration of the undesired signal performed at baseband is equivalent to a filtering function with very high gain at the carrier, that is, a very narrow-band filter having its frequency pass-band centered on the frequency of the undesired signal. To convert the digital words at the output of the up/down counter 110 back to the analog signal format of the undesired signal, the output signal of the up/down counter 110 is multiplied in a digital multiplier 116 by the carrier signal synchronous with the undesired signal. This signal is then summed in a digital adder 118 with a quadrature component of the undesired signal obtained from a similar arrangement using a second digital multiplier 120 and a second up/down counter 122, both fed with a quadrature undesired signal carrier signal. Thus, the integral of either or both the in-phase and quadrature components of the undesired signal are generated. Finally, the digital signal representing the cancellation signal for the undesired signal is converted to an analog format in the digital-to-analog converter 124, which may provide a coarse conversion to not completely cancel the undesired signal but rather reduce it to an acceptable, relatively low level.

The system of FIG. 7 can be used to provide analog output signals filtered with high frequency selectivity by using the output of amplifier subsystem 46 as the signal output, and may be applied to DSB-SC signals (as shown) or baseband signals directly.

Figure 8A:
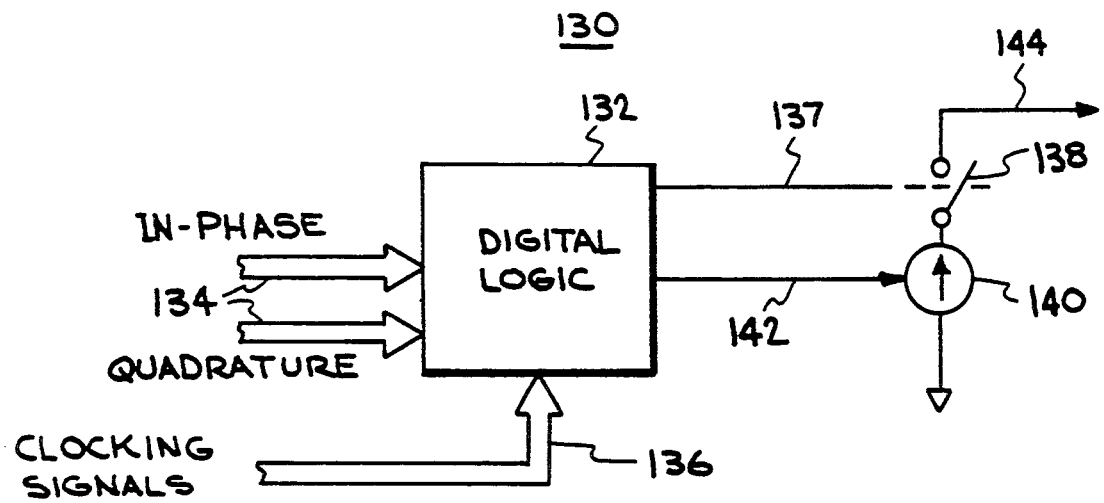
FIG. 8A shows a system for generating a DSB-SC signal from an input digital baseband signal.

FIG. 8A shows a form of a digital-to-analog system for precisely generating a cancellation signal for an undesired signal as discussed in connection with FIG. 7. When the desired signal must be recovered with great accuracy, it is desirable that the undesired signal be cancelled with some precision. This is particularly important regarding phase accuracy of the cancellation signal so that the cancellation signal has precise phase accuracy and does not crosstalk into the desired signal channel.

FIG. 8A shows a precision, pulse-width modulated digital-to-analog converter system 130 which includes a digital logic module 132. One set of input signals 134 to the module 132 includes a series of output digital words taken from the output of the up/down counters 110 and 112 of FIG. 7. Another set of input signals 136 are clocking signals derived from the in-phase desired carrier and the quadrature reference-frequency signals of the signal. The two sets of signals are processed in the logic module 132 to provide two signals: a pulse width control signal on signal line 137 which controls a switch 138 which in turn controls the width of current pulses from a current source 140. In the preferred embodiment shown, the polarity of the current source 140 is also controlled with an up/down-current signal on signal line 142.

Figure 8B:
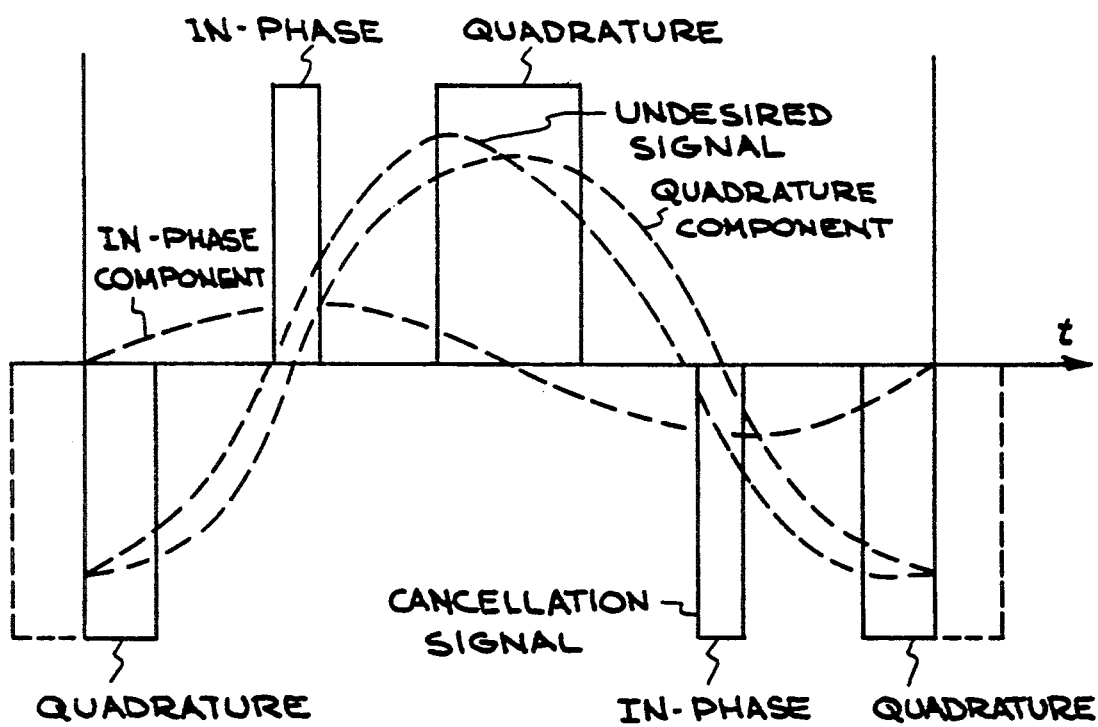
FIG. 8B shows a DSB-SC baseband signal waveform produced by the system of FIG. 8A.

FIG. 8B shows an output waveform present on signal line 144 which serves as a cancellation signal to be fed into, for example, the summer 48 of FIG. 7. The in-phase phase and the quadrature components of the undesired signal are shown for reference. Note that the in-phase component signal has lower amplitude than the quadrature component. The pulse-widths and polarity signals generated by the digital logic 132 are precisely controlled to generate a signal which has a fundamental component precisely in phase and with the same magnitude as the desired cancellation signal represented in digital form in counters 110 and 122. Note that the D/A converter system 130 takes baseband in-phase and quadrature signal components and with reference signals 36 generates a DSB-SC signal, performing the two functions of D/A conversion and modulation.

Types of feedback other than integral, such as proportional feedback, can be utilized separately or in characteristics by those skilled in the art.

The pulse-width modulation technique of FIGS. 8A and 8B rely on producing a pulse of constant amplitude, the width of which is varied in proportion to the strength of the interfering input signal in order to cancel that interfering input signal. A fundamental principle behind this technique is that the Fourier transform of the pulse-width modulated signal produce a component at the fundamental frequency, cancelling the interfering input sine-wave signal. This technique produces a considerable amount of harmonic-frequency components, due to the sharp pulses being produced. The pulse-width varies with the digital input signal and the harmonic content of the pulse-width- modulated signal varies depending upon the pulse-width. In addition, this pulse-width modulation technique requires that the pulses be placed at the center of each half cycle of the interfering sine-wave signal to avoid phase shifting of the cancellation signal with respect to the interfering The pulse-width modulation technique requires exact pulse placement to maintain proper phase relationship and precise pulse-width to provide for the amplitude of the cancellation signal. The cancellation signal has harmonic frequency components which vary with the input signal amplitude so that a low amplitude input signal has relatively high harmonic frequency components.

Figure 9:
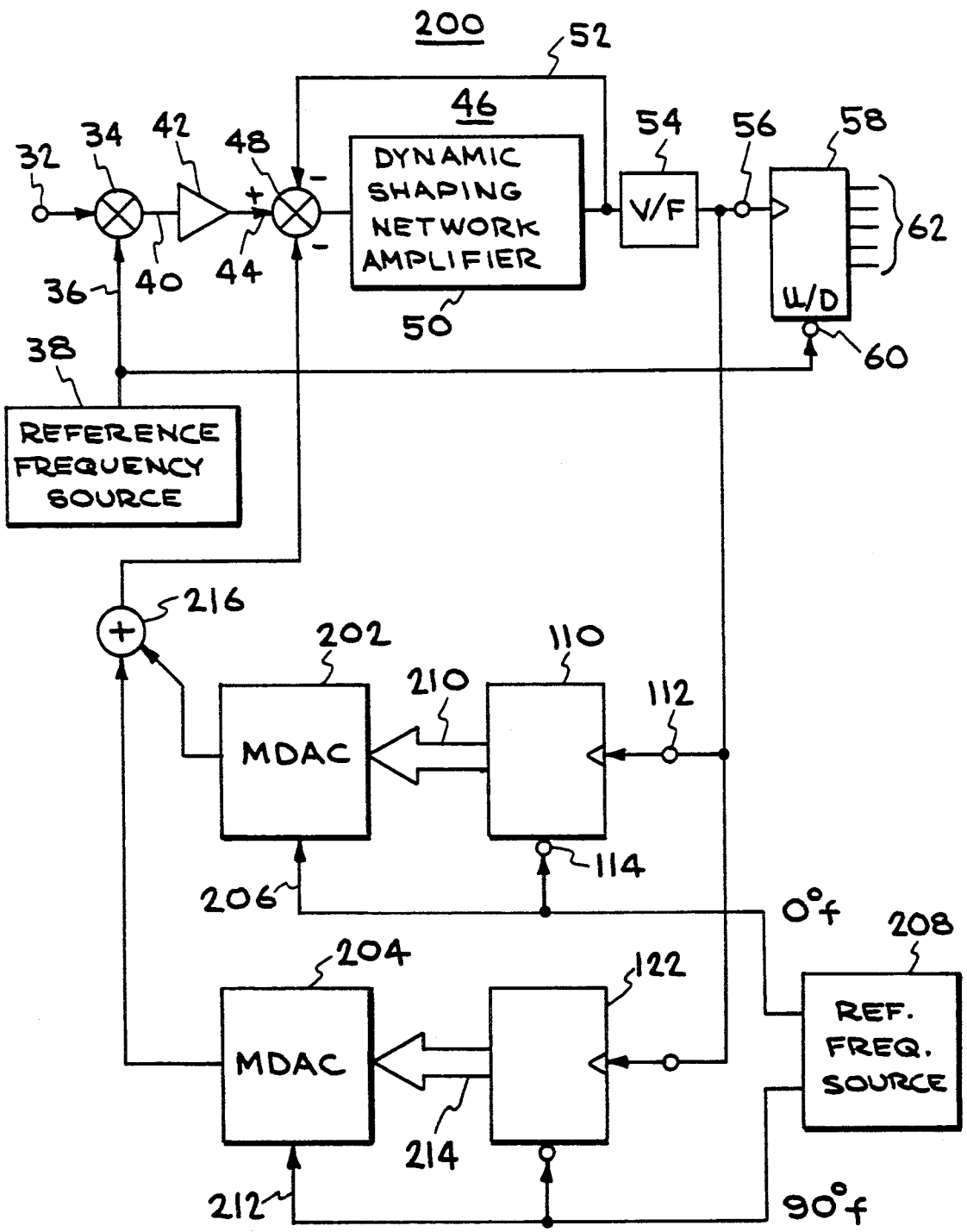
FIG. 9 shows a block diagram of another embodiment of a filter system for an undesired input signal, wherein the filter system uses a multiplying digital-to-analog converter in its cancellation feedback path.

FIG. 9 shows a block diagram of an alternative embodiment of a notch filter system 200 for rejecting an undesirable signal, having in-phase and quadrature signal components. The system uses the same elements in the forward signal path as are used in the system of FIG. 7, where like references numerals are used for like elements. The feedback path uses multiplying digital-to-analog converters 202, 204, respectively, in the in-phase cancellation channel and in the quadrature channel. The multiplying digital-to-analog converter 202 receives an in-phase reference signal on a signal line 206 from a reference frequency source 208. The same signal also is schematically shown as providing the demodulating up/down reference signal for the up/down counter demodulator 110. The output of the demodulator counter 110 are digital signals provided on a bus 210 to the multiplying converter 202. A constant amplitude sine wave signal is provided on signal line 206 and is multiplied in the converter 202 by the digital number provided by the digital demodulator 110. The reference frequency source 208 provides the constant amplitude sine-wave reference signal which is phase locked to the reference signal from the reference frequency source 38 using, for example, a phase-locked loop. The multiplying digital-to-analog converter 204 similarly has a quadrature reference signal provided on a signal line 212 from appropriately-phased output terminal of the reference frequency source 208, as indicated. This same quadrature reference signal on signal line 212 is provided to the up/down control terminal of the up/down counter 122, which provides a digital signal on an output bus 214 to the converter 204 as shown. The multiplying digital-to-converter converters 202, 204 essentially perform the following mathematical operation:

$$V_{out} = \frac{V_{in}}{2^{dk-1} - 1} (2^{d0} + 2^{d1} + \ldots + 2^{dk-1} + 2^{dk}) \quad (1)$$

In a standard non-multiplying digital-to-analog converter, the input signal is typically a fixed-value DC reference signal. Accordingly, the output signal $V_{out}$ is directly and linearly proportional to the digital input signal, where the digital input signal has its bits weighted in a binary fashion. In a multiplying digital-to-analog converter the reference signal is provided by an external analog reference input signal.

Consequently, the value of the output signal $V_{out}$ of the multiplying digital-to-analog converter is obtained by multiplying the analog input reference signal on lines 206, 212 by their respective binary digital words provided on buses 210, 214.

The feedback path of the system 200 provides an in-phase component and a quadrature component of the interfering input signal, each of which have discrete amplitude levels controlled by the digital outputs of the up/down counters 110, 122. These two components are summed together in a summer 216 and added out-of-phase to the input signal to the summer 48 to thereby cancel the interfering input signal. Note that the phase of the cancellation signals are not subject to quantization errors, such as in a pulse-width modulation system where a correction pulse needs to be centered precisely in-phase with the interfering signal. In this embodiment of the invention, the composite cancellation signal is a sine-wave, which has very small harmonic-frequency components. The amplitude of the cancellation signal is digitally controlled and its accuracy can be selected by choosing an appropriate number of bits for the multiplying digital-to-analog converters 202, 204. This technique is also suited to implementation in either discrete component form or in an application-specific integrated circuit ASIC form.

In order to handle both positive and negative analog input signals and to handle both positive and negative digital code words, merely offsetting these signals with a fixed offset voltage level or an offset binary number may produce an unwanted noise component. This is caused by the least significant bit LSB of the offset signal being unstable so that a square wave at the demodulation frequency is produced. This square wave is indistinguishable from a desired signal. Elimination of the offset terms would remove this source of error. Many digital-to-analog converters use an R-2R ladder and a binary-weighted current-source/switch combination to realize a digital-to-analog converter element. Generally, uni-directional current sources are used because they are easier to implement. Consequently, to perform full four-quadrant multiplication, either an external multiplier is used or a CMOS digital-to-analog converter is used which allows bi-directional current switching to be performed.

Figure 10:
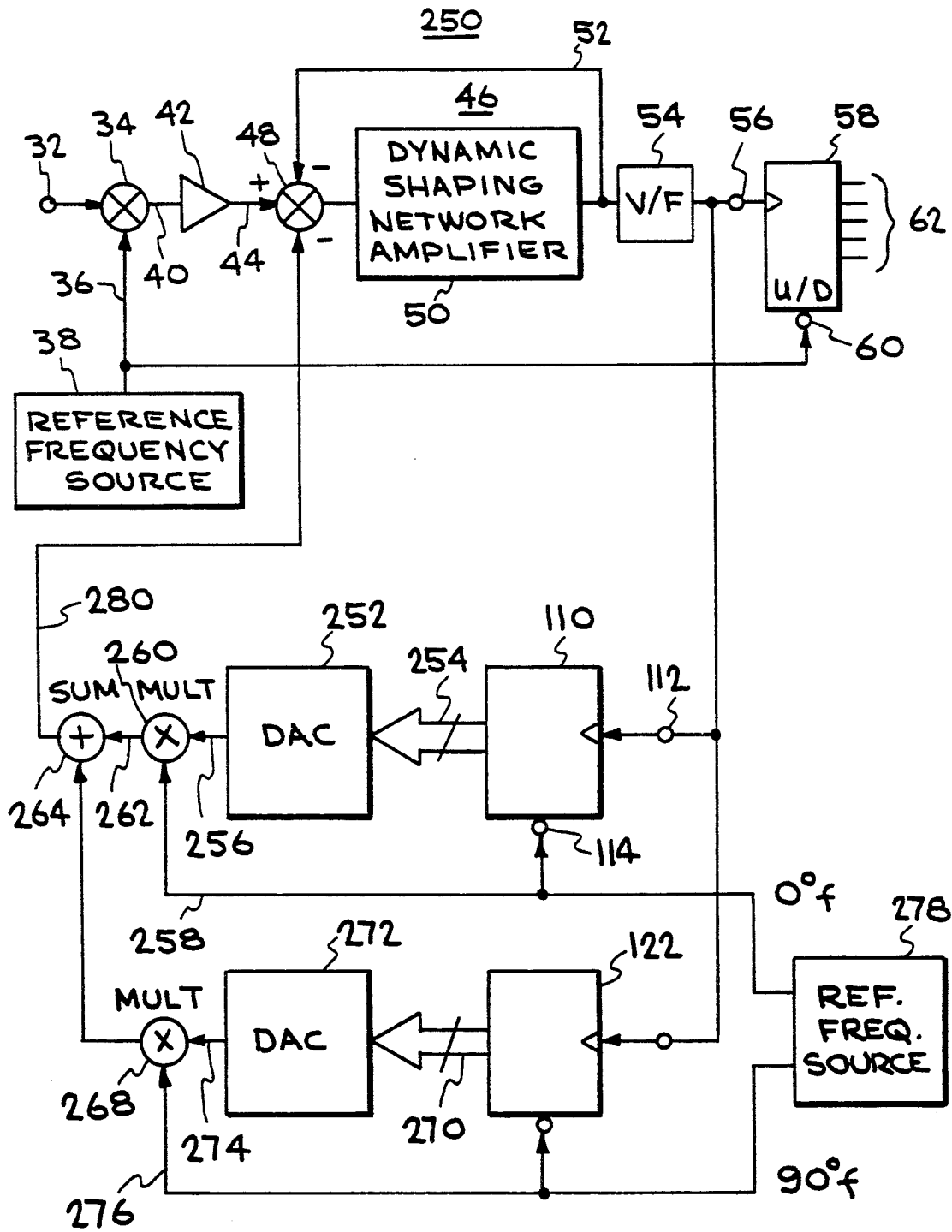
FIG. 10 shows a block diagram of another embodiment of a filter system, which converts the baseband in-phase and quadrature digital output signal components from the up/down counters to analog signals, which are modulated and summed together.

The feedback circuit of FIG. 10 has multipliers 260, 268 which can be implemented as four-quadrant multipliers.

FIG. 10 shows a block diagram of another embodiment of a cancellation filter system 250. This uses a digital-to-analog converter 252 for converting the binary outputs on bus 254 from the up/down counter 110 to a baseband analog signal on a signal line 256. This analog version of the binary signal is multiplied by a reference signal provided on a signal line 258 in a multiplier 260. This provides the in-phase component of the interfering signal on signal line 262 which feeds one input terminal of a summer 264. The other input to the summer 264 is provided on a signal line 266 from another multiplier 268. The binary output signal from the up/down counter converter 122 is fed on a signal bus 270 to a digital-to-analog converter 272, the output of which is fed on a signal line 274 to one input terminal of the multiplier 268. The other input to the multiplier 268 is received on a signal line 276 from a quadrature reference source. Both the in-phase reference provided on signal line 258 and the quadrature phase reference signal provided on signal line 276 are received from a reference frequency source 278 which provides an analog reference signal for the system. The summed output of the summer 264 provided on a signal line 280 to an input terminal of the summer 48.

Figure 11:
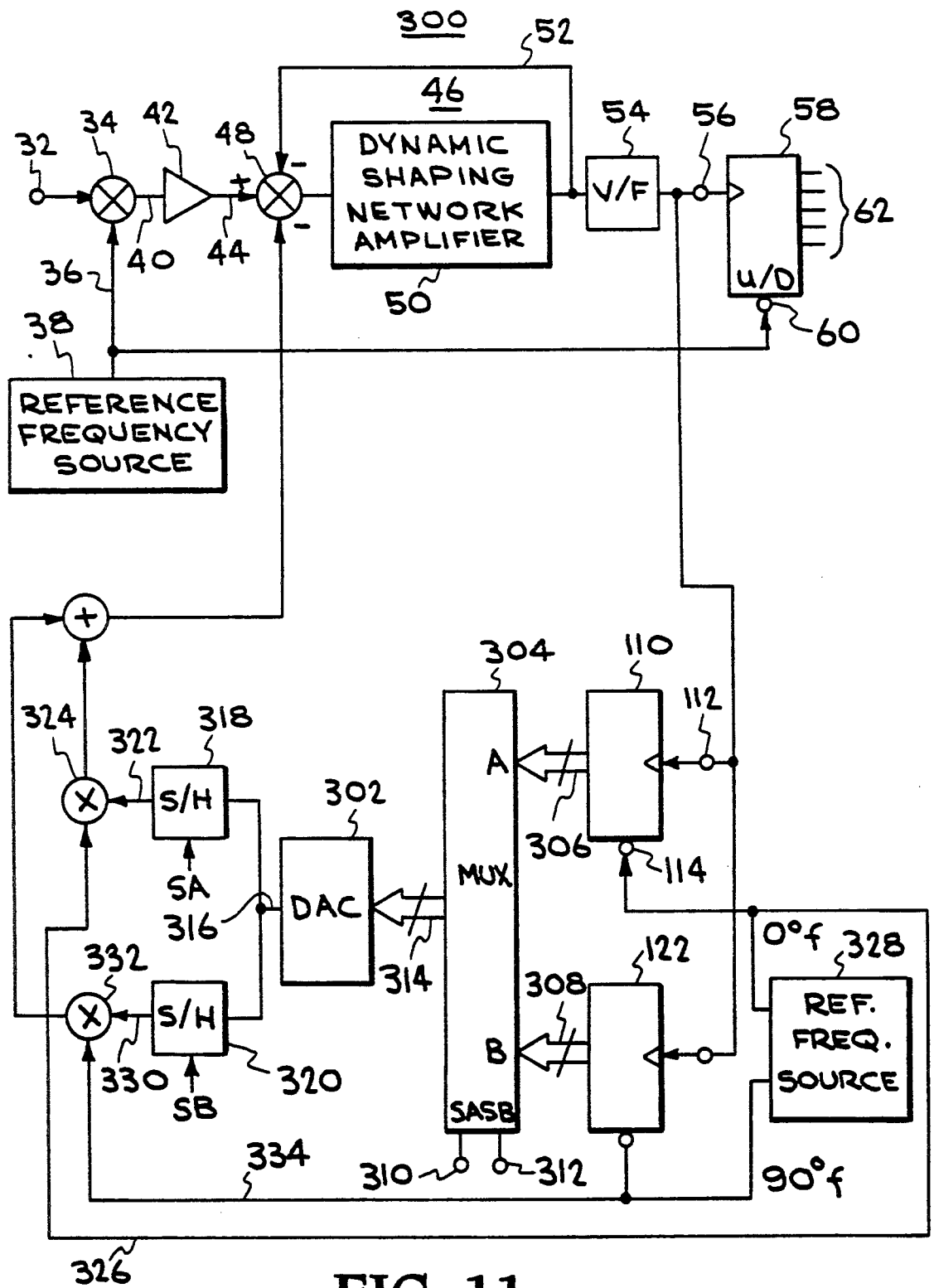
FIG. 11 shows a block diagram of another embodiment of a cancellation filter system, using a multiplexer and a single digital-to-analog converter for processing the in-phase and the quadrature components of a cancellation signal.

FIG. 11 shows a filter system 300 which uses a multiplexed digital-to-analog converter 302. Implementation of a number of parallel feedback cancellation loops requires use of an independent digital-to-analog converter for each. Since these digital-to-analog converters may be, for example, at least 12-bits wide, an integrated circuit which implements the several digital-to-analog converters would require a very large number of dedicated terminal pins. Alternatively, the various parallel feedback signals are time multiplexed using the scheme shown in FIG. 11. The digital-to-analog converter 302 is shared, as shown in the Figure, between two up/down counters 110, 122 using a 2-bus input multiplexer 304. The input bus 306 from the up/down counter 110 is designated as input A to the multiplexer 304 while the input signals on the bus 308 from the up/down counter 122 are designated as input B. Either signals A or signals B are selected using the input terminals 310, 312, respectively, to provide the signals on the multiplexer output bus 314. These signals are respectively converted by the digital-to-analog converter 302 which provides an analog signal on output signal line 316, which is coupled to the input terminals of two sample-and-hold circuits 318, 320. The sample and hold circuits 318, 320 are controlled respectively by the control signals SA and SB. While the A channel signals are being processed by the digital-to-analog converter 302 the previous output signals for channel B are held by the sample-and-hold circuit 320. In a similar manner, the sample-and-hold circuit 318 holds the output signals of the digital-to-analog converter 302 for channel A. The sample signals of the sample-and-hold-circuit 318 are fed on a signal line 322 to one input terminal of a multiplier 324. The other input terminal of the multiplier 324 is coupled to a signal line 326 which is provided the in-phase reference signal from a reference frequency source 328. Similarly, the output signal from the sample and hold circuit 320 is fed on a signal line 330 to one input terminal of another multiplier circuit 332, which has a quadrature reference signal provided on a signal line 334 from the appropriate output of the reference frequency source 328. This arrangement provides for cancellation of the two components of an interfering signal by time-multiplexing of the digital-to-analog converter 302.

Figure 12:
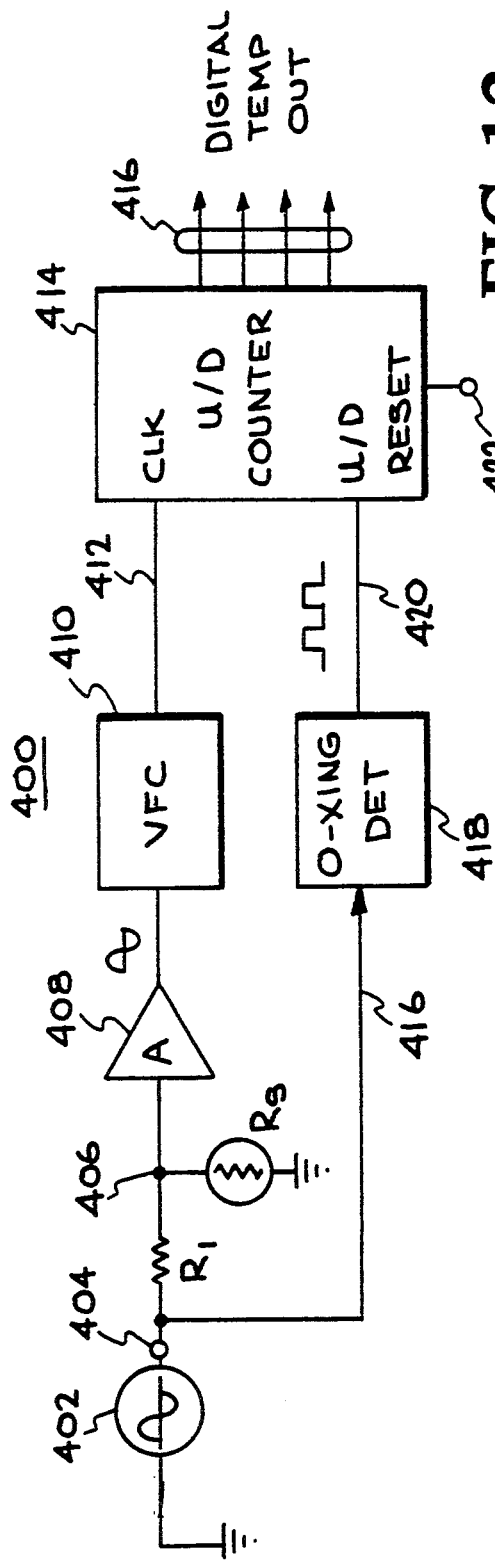
FIG. 12 shows a block diagram of a precision parameter sensor such as a temperature sensor, which incorporates a voltage-to-frequency converter and a synchronous digital demodulator to provide a digital representation of the temperature value.

FIG. 12 shows a precision sensing, or measurement, system 400. The system includes a precision source 402 for a reference-frequency signal. The output terminal of the reference-frequency signal source 402 is connected to an input terminal 404 for the system. A parameter-sensing circuit is provided by the voltage divider circuit formed by the series resistor R1 connected between the input terminal 404 and a terminal 406. A parameter-sensitive resistor $R_s$ is connected between the terminal 406 and a ground reference potential. As the resistance of the parameter-sensitive element $R_s$ varies, the amplitude of the reference-frequency signal appearing at terminal 406 is modulated, or varied in value, depending upon the magnitude of the parameter-sensitive resistor $R_s$. Note that in this example the carrier signal is not suppressed. Terminal 406 is coupled to the input terminal of an amplifier 408. The output terminal of the amplifier 408 is connected to the input terminal of a voltage-to-frequency converter circuit 410, which provides an output signal which is a series of digital pulses having a repetition rate, or frequency, which is proportional to the voltage level of the signal at the input terminal of the voltage-to-frequency converter 410.

The output signal pulses of the voltage-to-frequency converter 410 are applied to the input signal terminal 412 of an up/down frequency counter 414. This counter functions as a digital accumulator, or integrator, of the signal pulses from the voltage-to-frequency converter 410. Since the various frequencies represent various voltage levels at terminal 406 of the voltage divider, the output pulse stream of the voltage-to-frequency converter 410 represents the voltage at terminal 406 encoded in a frequency format. The output reading of the up/down counter 414 represents the integral of the voltage at the terminal 406 as a digital or binary number. The reference-frequency signal provided at terminal 404 of the system is applied on a signal line 416 to the input terminal of a zero-crossing detector 418, which provides a square-wave signal to the up/down counter control terminal on signal line 420. This signal is applied to the up/down counter control terminal to change the counting direction of the counter depending on the polarity of that signal. For an up-count, the input pulses to the up/down counter 414 are added to the counter output total, while for a down-count, the input pulses are subtracted from the counter output total. The output count of the up/down counter 414 is provided on a plurality of bit lines, collectively indicated as 416, to provide a digital word representing the integral of the parameter being measured.

Figure 13:
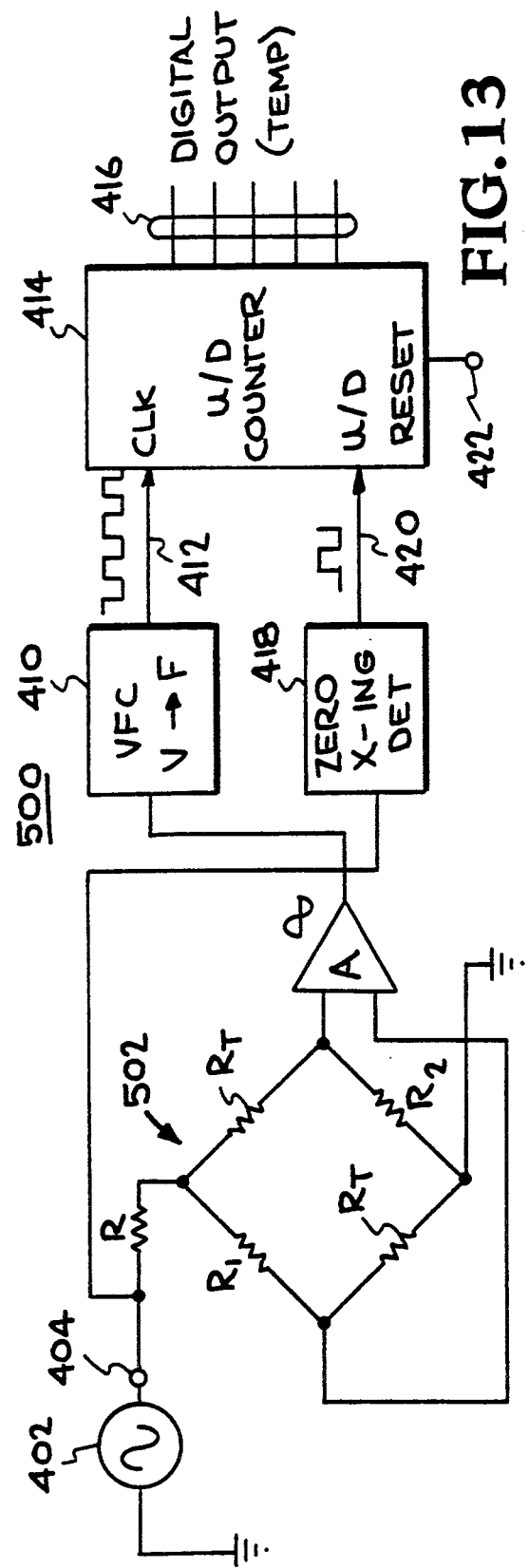
FIG. 13 shows a bridge configuration for the parameter-sensitive elements of a precision sensor according to the invention.

As shown in FIGS. 12 and 13, the up/down counter 414 includes a reset terminal 422. Note that at the end of each full cycle of the reference-signal the counter output represents the samples of the integral of the baseband signal as a function of time. Also note that if the counter is read and reset, periodically, for example at the end of each cycle of the reference-signal, then the readings will be proportional to the baseband signal rather than its integral.

The measurement system as shown in FIG. 12 is insensitive to the D.C. characteristics of the electronic devices used. The analog signals can be A.C. coupled using coupling capacitors. The up/down counter rejects any D.C. shifts by handling them as common mode signals, so long as the duty cycle of the up/down control signal on line 420 is nearly equal to 50%. This FIG. 13 shows an alternative embodiment of a more sensitive sensing system 500 which includes a full bridge circuit 502 which functions as a parameter-sensing sensing means. Reference numerals are used for components of the system which are similar to those of FIG. 12. The bridge circuit 502 includes two parameter-sensitive resistors $R_T$ in opposite arms of the bridge.

Other arrangements of sensing element in bridge circuits and other alternative circuit arrangements are possible. For example, an AC current source could drive a parameter-sensitive resistor or bridge-circuit to generate the amplitude-modulated signal.

Figure 14:
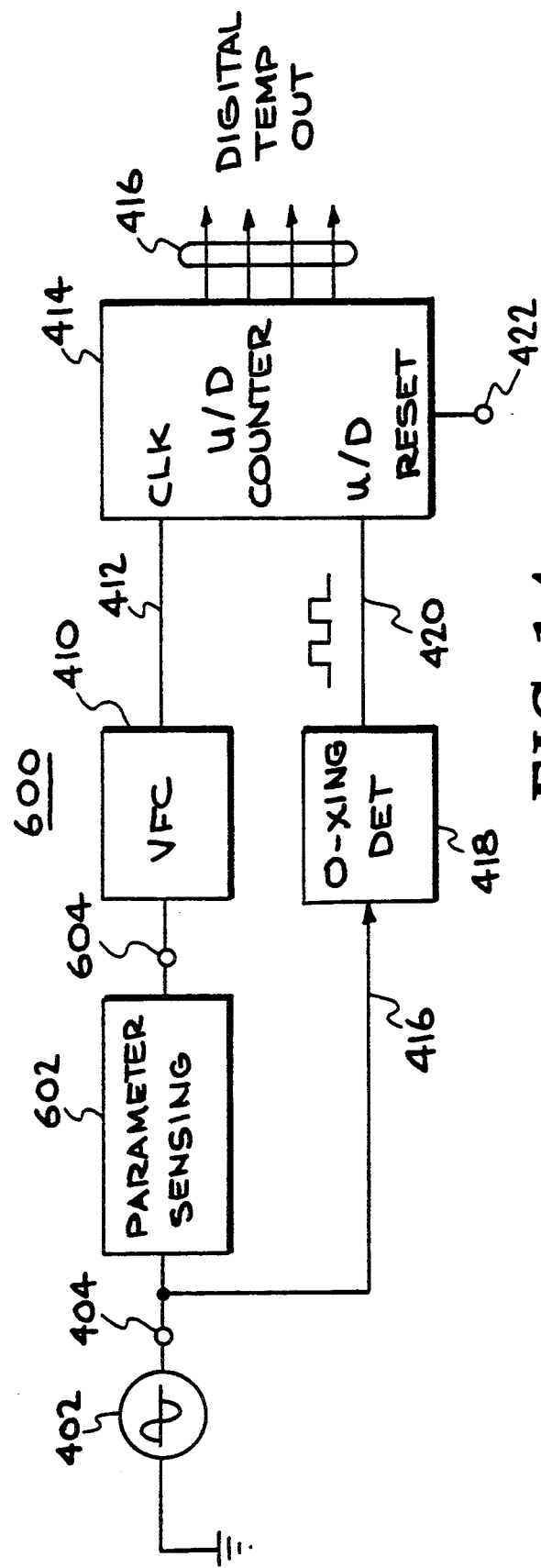
FIG. 14 shows a generic parameter-sensing element used in a precision sensor according to the invention.

FIG. 14 shows a generic precision sensing or measurement system 600, where like reference numerals are used elements similar to those of FIGS. 12 and 13. The system includes a precision source 402 for a reference-frequency signal. The output terminal of the reference-frequency signal source 402 is connected to an input terminal 404 for the system. A parameter-sensing circuit 602 is connected between the terminal 404 and an input terminal 604 of the voltage-to-frequency converter 410. As the parameter value of the parameter-sensing circuit 602 varies, the amplitude of the reference-frequency signal appearing at terminal 604 is modulated, or varied in value.

The output signal pulses of the voltage-to-frequency converter 410 are applied to the input signal terminal 412 of an up/down frequency counter 414. This counter functions as a digital accumulator, or integrator, of the signal pulses from the voltage-to-frequency converter 410. Since the various frequencies represent various voltage levels at terminal 406 of the voltage divider, the output pulse stream of the voltage-to-frequency converter 410 represents the voltage at terminal 406 encoded in a frequency format. The output reading of the up/down counter 414 represents the integral of the voltage at the terminal 406 as a digital or binary number. The reference-frequency signal provided at terminal 404 of the system is applied on a signal line 416 to the input terminal of a zero-crossing detector 418, which provides a square-wave signal to the up/down counter control terminal on signal line 420. This signal is applied to the up/down counter control terminal to change the counting direction of the counter depending on the polarity of that signal. For an up-count, the input pulses are substrated from the counter output total. The output count of the up/down counter 414 is provided on a plurality of bit lines, collectively indicated as 416, to provide a digital word repesenting the integral of the parameter being measured. Note that at the end of each full cycle of the reference-signal the counter output represents samples of the integral the baseband signal as a function of time. Also note that if the counter is read and reset periodically, for example, at the end of each cycle of the reference-signal, then the readings will be proportional to the baseband signal itself rather than the integral of the baseband signal. The up-down counter 414 includes a reset terminal 422.

The parameters measured, using the concepts disclosed in FIGS. 12, 13 and 14, include temperature, pressure, strain, force, light intensity, capacitance, electromotive force, inertial accelerations or angular rates, relative displacements or rates, or any parameter which is encoded as an amplitude of a carrier signal at the input to a voltage-to-frequency converter. It is intended that this invention is not limited to the specific embodiments shown.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable other skilled in the art to best utilize the invention and various embodiments with various modifications as are suited to the particular use contemplated. It is intended that the scope of the invention be defined by the claims appended hereto and their equivalents.

We claim:

1. A system for sensing a parameter, comprising:
a source for providing a reference signal of predetermined frequency;
means responsive to the parameter and to the reference signal for providing a modulated signal having a frequency corresponding to the frequency of the reference signal and an amplitude corresponding to the value of the parameter;
a voltage-to-frequency converter responsive to the modulated signal for providing an output signal having a frequency corresponding to the level of the modulated signal;
a frequency-to-digital converter including an up-down frequency counter having a counting input to which the output signal from the voltage-to-frequency converter is applied and an up-down control input to which the reference signal is applied for switching the counting direction of said up-down counter in synchronism with said reference signal to thereby demodulate the output signal from the voltage-to-frequency converter.

2. The system of claim 1 wherein said up-down frequency counter provides a digital output signal representative of the integral of the sensed parameter.

3. The system of claim 1 including means for periodically resetting said frequency counter to thereby provide a digital output signal proportional to the sensed parameter.

4. The system of claim 1 wherein the reference signal is a sinewave signal.

5. The system of claim 1 wherein the means responsive to the parameter includes a voltage divider circuit having a parameter-sensitive element.

6. The system of claim 1 wherein the means responsive to the parameter includes a bridge circuit having one or more parameter-sensitive elements.

7. The system of claim 6 wherein the bridge circuit includes two opposite arms having parameter-sensitive elements.

8. The system of claim 1 including signal amplifier means coupled to the input of the voltage-to-frequency converter for amplifying the modulated signal.

9. The system of claim 1 including means for converting the reference signal to digital form before it is applied to the up-down control input of the up-down frequency counter.

10. The system of claim 1 wherein the means responsive to the parameter includes means responsive to temperature.

11. The system of claim 1 wherein the means responsive to the parameter includes means responsive to pressure.

12. The system of claim 1 wherein the means responsive to the parameter includes means responsive to a parameter selected from the group consisting of inertial acceleration, strain, inertial angular rate, force, light intensity, capacitance, electromotive force, relative displacement, and relative rate of displacement.

* * * * *